United States Patent
Nishi et al.

(10) Patent No.: US 8,723,152 B2
(45) Date of Patent: May 13, 2014

(54) VARIABLE RESISTANCE MEMORY

(75) Inventors: Yoshifumi Nishi, Yokohama (JP); Hidenori Miyagawa, Yokohama (JP); Daisuke Matsushita, Fujisawa (JP); Jun Fujiki, Yokohama (JP); Takeshi Imamura, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 13/425,687

(22) Filed: Mar. 21, 2012

(65) Prior Publication Data

US 2013/0037776 A1 Feb. 14, 2013

(30) Foreign Application Priority Data

Aug. 9, 2011 (JP) ................................. 2011-173912

(51) Int. Cl.
*H01L 47/00* (2006.01)

(52) U.S. Cl.
USPC ................. 257/3; 257/E45.002; 257/E45.003

(58) Field of Classification Search
USPC ............................... 257/3, E45.002, E45.003
See application file for complete search history.

(56) References Cited

U.S. PATENT DOCUMENTS

| | | | |
|---|---|---|---|
| 6,621,095 B2* | 9/2003 | Chiang et al. | 257/5 |
| 6,936,840 B2* | 8/2005 | Sun et al. | 257/30 |
| 7,323,708 B2* | 1/2008 | Lee et al. | 257/3 |
| 7,479,649 B2* | 1/2009 | Lung | 257/2 |
| 7,816,661 B2* | 10/2010 | Lai et al. | 257/4 |
| 7,928,421 B2* | 4/2011 | Lung | 257/3 |
| 2006/0226409 A1* | 10/2006 | Burr et al. | 257/2 |
| 2007/0090336 A1* | 4/2007 | Asano et al. | 257/3 |
| 2007/0097739 A1* | 5/2007 | Happ et al. | 365/163 |
| 2008/0237566 A1* | 10/2008 | An et al. | 257/4 |
| 2008/0248632 A1* | 10/2008 | Youn et al. | 438/483 |
| 2009/0023242 A1* | 1/2009 | Lung | 438/102 |
| 2009/0101883 A1* | 4/2009 | Lai et al. | 257/3 |
| 2009/0108333 A1* | 4/2009 | Kito et al. | 257/324 |
| 2009/0148981 A1* | 6/2009 | Lai et al. | 438/102 |
| 2009/0242865 A1* | 10/2009 | Lung et al. | 257/2 |
| 2010/0019221 A1* | 1/2010 | Lung et al. | 257/5 |
| 2010/0102289 A1* | 4/2010 | Dimitrov et al. | 257/2 |
| 2010/0124813 A1* | 5/2010 | Matamis et al. | 438/478 |
| 2010/0213550 A1* | 8/2010 | Kanno et al. | 257/379 |
| 2010/0320435 A1* | 12/2010 | Tu | 257/4 |
| 2011/0147692 A1* | 6/2011 | Park et al. | 257/2 |
| 2011/0266511 A1* | 11/2011 | Shen et al. | 257/3 |
| 2011/0305064 A1* | 12/2011 | Jo et al. | 365/148 |

OTHER PUBLICATIONS

Sung Hyun Jo, et al., "CMOS Compatible Nanoscale Nonvolatile Resistance Switching Memory", Nano Letters 2008 vol. 8, No. 2, 6 pages.

* cited by examiner

*Primary Examiner* — David S Blum
(74) *Attorney, Agent, or Firm* — Oblon, Spivak, McClelland, Maier & Neustadt, L.L.P.

(57) ABSTRACT

A variable resistance memory according to an embodiment includes: a first wiring; a second wiring intersecting with the first wiring; a first electrode provided in an intersection region between the first wiring and the second wiring, the first electrode being connected to the first wiring; a second electrode connected to the second wiring, the second electrode facing to the first electrode; a variable resistance layer provided between the first electrode and the second electrode; and one of a first insulating layer and a first semiconductor layer formed at side portions of the second electrode. The one of the first insulating layer and the first semiconductor layer, and the second electrode form voids at the side portions of the second electrode.

16 Claims, 7 Drawing Sheets

(a)

(b)

(c)

A-A CROSS-SECTION

B-B CROSS-SECTION

B-B CROSS-SECTION

B-B CROSS-SECTION

B-B CROSS-SECTION

B-B CROSS-SECTION

B-B CROSS-SECTION

VARIABLE RESISTANCE MEMORY

CROSS-REFERENCE TO RELATED APPLICATION

This application is based upon and claims the benefit of priority from prior Japanese Patent Application No. 2011-173912 filed on Aug. 9, 2011 in Japan, the entire contents of which are incorporated herein by reference.

FIELD

Embodiments described herein relate generally to variable resistance memories.

BACKGROUND

Variable resistance memories are now drawing attention as large-capacity memories that are to replace flash memories known as large-capacity semiconductor memory devices.

A variable resistance memory is a memory in which two-terminal variable resistance elements each having a variable resistance layer interposed between two electrodes are used as memory elements. In such a variable resistance memory, information writing and erasing are performed by utilizing reversible changes in a variable resistance layer between a high-resistance state and a low-resistance state due to the history of voltage application between the electrodes. Even if the voltage between the two electrodes is cut off, the resistance state of the variable resistance layer is maintained. Therefore, "variable resistance memory" is a type of nonvolatile memory.

Variable resistance elements are classified into several types based on the types of variable resistance layers and electrodes. Redox variable resistance elements that utilize movement of oxygen defects of transition metal oxides, ion-conducting variable resistance elements that utilize movement of metal ions or the like in the variable resistance layers, and the like are known.

Materials with relatively high compatibilities with the materials used in silicon CMOS processes are used in ion-conducting variable resistance elements. Therefore, those ion-conducting variable resistance elements are drawing attention as the next-generation semiconductor memory elements. For example, variable resistance elements in which a thin amorphous silicon film is formed as a variable resistance layer on a p-type highly-doped silicon substrate, and a silver electrode is formed on the variable resistance layer are known.

However, the above described ion-conducting variable resistance elements have the following problems the inventors have found. In each of the above ion-conducting variable resistance elements, one electrode (hereinafter also referred to as an ion source electrode) is made of silver, which supplies ions, and the other electrode (hereinafter also referred to as an opposite electrode) is made of highly-doped silicon.

In a case where such variable resistance elements are used as storage elements in a large-capacity storage device, a stack structure that is of a cross-point type and has storage-element-containing films stacked on one another needs to be formed to achieve a large capacity. In this case, the storage elements arranged in the same layer share an opposite electrode, and there is write current leakage or read current leakage between adjacent cells via the opposite electrode and the wirings connected to the opposite electrode.

DETAILED DESCRIPTION

A variable resistance element according to an embodiment includes: a first wiring; a second wiring intersecting with the first wiring; a first electrode provided in an intersection region between the first wiring and the second wiring, the first electrode being connected to the first wiring; a second electrode connected to the second wiring, the second electrode facing to the first electrode; a variable resistance layer provided between the first electrode and the second electrode; and one of a first insulating layer and a first semiconductor layer formed at side portions of the second electrode. The one of the first insulating layer and the first semiconductor layer, and the second electrode form voids at the side portions of the second electrode.

The following is a description of embodiments, with reference to the accompanying drawings.

First Embodiment

Figure 1:
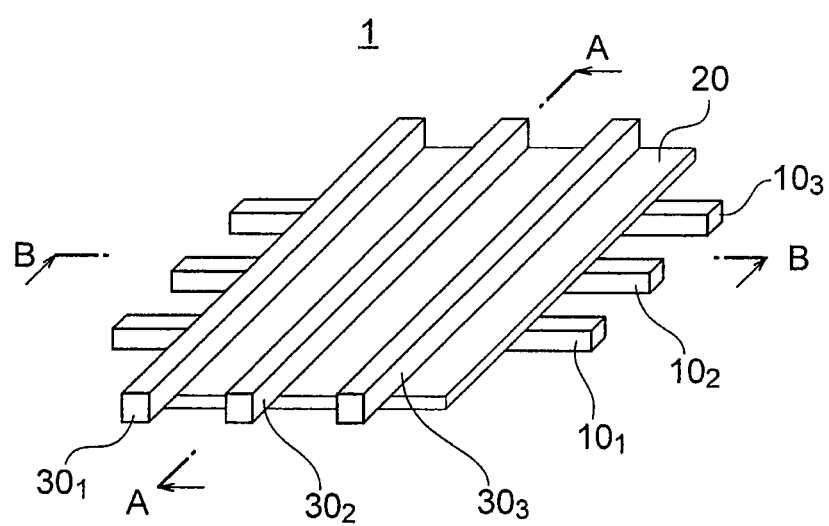
FIG. 1 is a perspective view of a variable resistance memory according to a first embodiment.
Figure 2A:
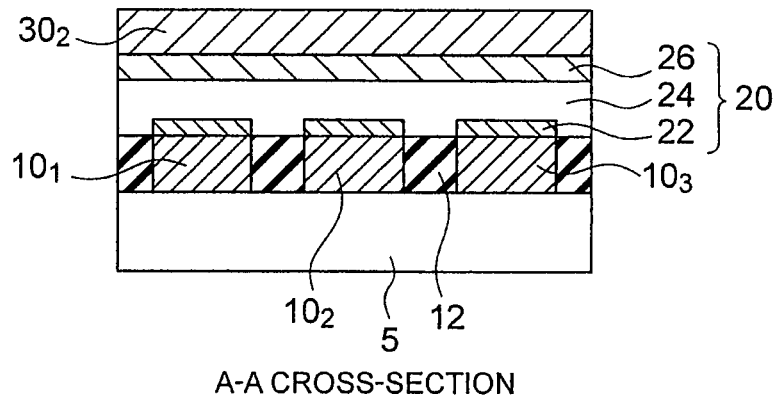
FIG. 2A is a cross-sectional view of the variable resistance memory according to the first embodiment.
Figure 2B:
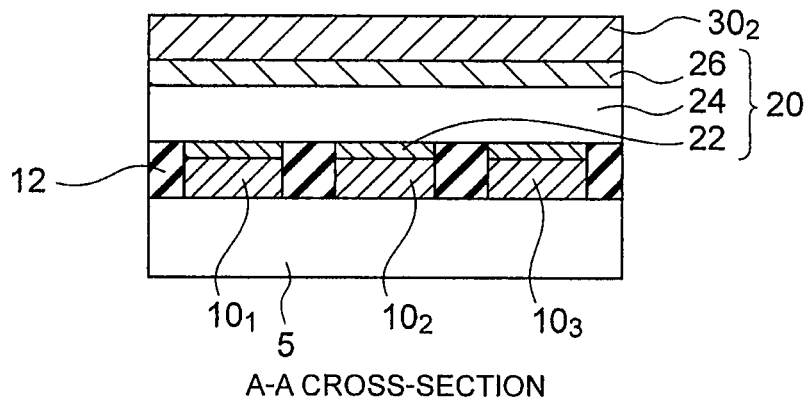
FIG. 2B is a cross-sectional view of the variable resistance memory according to the first embodiment.
Figure 3:
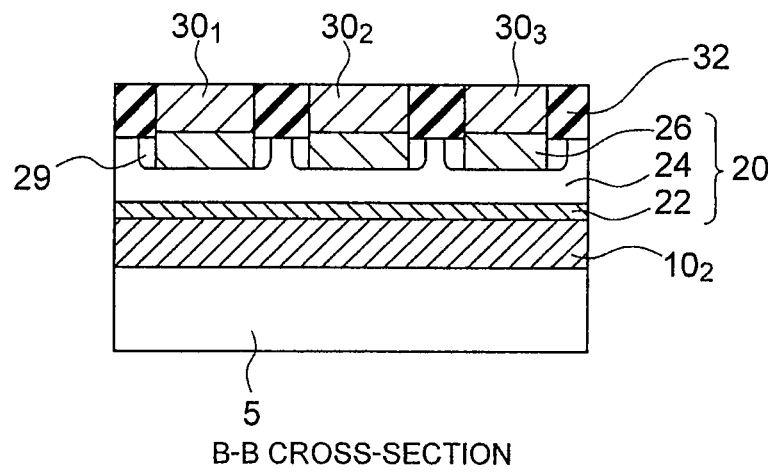
FIG. 3 is a cross-sectional view of the variable resistance memory according to the first embodiment.

Referring to FIGS. 1 through 3, a variable resistance memory according to a first embodiment is described. FIG. 1 is a perspective view of the variable resistance memory 1 of the first embodiment. FIGS. 2A and 2B are cross-sectional views of the variable resistance memory 1, taken along the section plane A-A of FIG. 1. FIG. 3 is a cross-sectional view of the variable resistance memory 1, taken along the section plane B-B of FIG. 1.

The variable resistance memory 1 of the first embodiment is a cross-point type variable resistance memory. In the variable resistance memory 1, first wirings $10_1$, $10_2$, and $10_3$ connected in parallel are provided on a supporting substrate 5. Those first wirings $10_1$, $10_2$, and $10_3$ are electrically insulated from one another by an interlayer insulating film 12. A variable resistance element layer 20 is provided on those first wirings $10_1$, $10_2$, and $10_3$, and on the interlayer insulating film 12. This variable resistance element layer 20 includes ion source electrodes 22, a variable resistance layer 24, and opposite electrodes 26. Second wirings $30_1$, $30_2$, and $30_3$ are provided on the variable resistance element layer 20. The second wirings $30_1$, $30_2$, and $30_3$ are arranged in parallel to one another and perpendicularly to the first wirings $10_1$, $10_2$, and $10_3$. Those second wirings $30_1$, $30_2$, and $30_3$ are electrically insulated from one another by an interlayer insulating film 32. The portions of the variable resistance element layer 20 at which the first wirings $10_1$, $10_2$, and $10_3$ intersect with the second wirings $30_1$, $30_2$, and $30_3$ serve as memory cells. By applying a voltage to the first wirings and the second wirings connected to the memory cells, the resistance status of the variable resistance layer of the variable resistance element is changed. In this embodiment, each memory cell is a variable resistance element including the ion source electrode 22, the variable resistance layer 24, and the opposite electrode 26.

Figure 4:
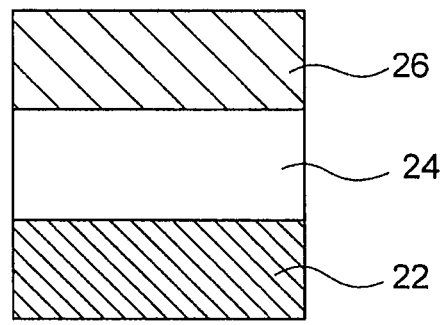
FIGS. 4(a) through 4(c) are cross-sectional views of a variable resistance element according to the first embodiment.
Figure 4:
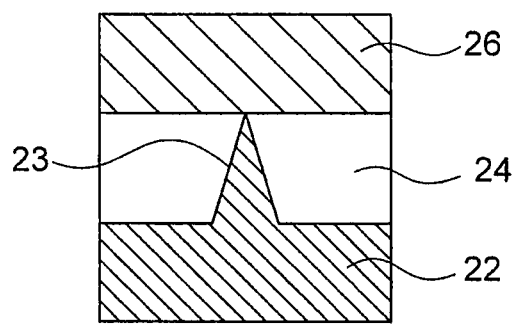
Figure 4:
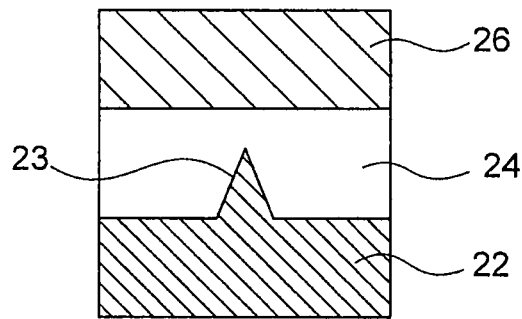

Referring now to FIGS. 4(*a*) through 4(*c*), an operation of a memory cell (a variable resistance element) having the above described structure is described. As shown in FIG. 4(*a*), in a variable resistance element having the ion source electrode 22, the variable resistance layer 24, and the opposite electrode 26 stacked in this order, a voltage is applied between the ion source electrode 22 and the opposite electrode 26. When a positive voltage is applied to the ion source electrode 22 as opposed to the opposite electrode 26, an electric field is generated in the direction from the ion source electrode 22 to the opposite electrode 26. As a result, the metal atoms forming the ion source electrode 22 are ionized at the interface between the ion source electrode 22 and the variable resistance layer 24, and move inside the variable resistance layer 24 toward the opposite electrode 26, to form a metal-atom filament 23, as shown in FIG. 4(*b*). With this filament 23, the ion source electrode 22 and the opposite electrode 26 are electrically connected to each other, and the variable resistance layer 24 is put into a low-resistance state (hereinafter referred to as "setting"). Here, the direction of the voltage is reversed. That is, a negative voltage is applied to the ion source electrode 22 as opposed to the opposite electrode 26. As a result, an electric field is generated in the variable resistance layer 24 in the direction from the opposite electrode 26 to the ion source electrode 22. The metal atoms forming the filament 23 are ionized and move toward the ion source electrode 22. As shown in FIG. 4(*c*), the metal atoms existing in the vicinity of the interface between the variable resistance layer 24 and the opposite electrode 26 also move toward the ion source electrode 22, and the filament 23 is electrically insulated from the opposite electrode 26. As a result, the variable resistance layer 24 transits to a high-resistance state (hereinafter also referred to as "resetting"). That is, the resistance state of this memory cell varies with the size of the filament 23.

Also, as shown in FIG. 3, in each memory cell, voids 29 are formed at the side portions of the opposite electrode 26 that are located close to the face (the lower face, in the drawing) of the opposite electrode 26 facing the ion source electrode 22. With the voids 29, the opposite electrode 26 and the opposite electrode of each adjacent memory cell are electrically insulated from each other, and current leakage between adjacent cells can be prevented.

In FIGS. 1 through 3, the variable resistance element layer 20 is formed by stacking the ion source electrode 22, the variable resistance layer 24, and the opposite electrode 26 in this order. However, the variable resistance element layer 20 can be formed by stacking the components in the reverse order, or by stacking the opposite electrode 26, the variable resistance layer 24, and the ion source electrode 22 in this order.

The first wirings $10_1$ through $10_3$ are conductors each having a width and thickness of several nanometers to several tens of nanometers, for example, and the second wirings $30_1$ through $30_3$ are also conductors each having a width and thickness of several nanometers to several tens of nanometers, for example.

The ion source electrode 22 of each variable resistance element is made of a metal that emits metal ions when a positive voltage is applied to the opposite electrode 26. Examples of materials for the ion source electrodes 22 include Ag, Cu, Au, Al, W, Ti, and Co. In this embodiment, Ag is used for the ion source electrodes 22. In this embodiment, the ion source electrodes 22 are formed in the plane in which the first wirings $10_1$ through $10_3$ and the interlayer insulating film 12 are flattened, and are located on the first wirings $10_1$ through $10_3$, as shown in FIG. 2A. However, as shown in FIG. 2B, the ion source electrodes 22 can be formed on the first wirings $10_1$ through $10_3$, and have the side portions covered with the interlayer insulating film 12, like the first wirings $10_1$ through $10_3$. That is, the ion source electrodes 22 should be located at least on the first wirings $10_1$ through $10_3$. A stable metal that is not ionized as easily as the ion source electrodes 22 is preferably used for the first wirings $10_1$ through $10_3$. Examples of such materials include W, Mo, Ta, TiN, TiC, TaN, TaC, $TiSi_2$, $CoSi_2$, NiSi, $NiSi_2$, PtSi, $WSi_2$, and $MoSi_2$.

In the first embodiment and the later described second through fourth embodiments, the variable resistance layer 24 is an amorphous silicon (Si) layer having a film thickness of several nanometers to several tens of nanometers. Instead of amorphous silicon, it is possible to use an amorphous semiconductor such as amorphous germanium (Ge), amorphous silicon germanium (SiGe), amorphous silicon carbon, amorphous silicon carbide, or amorphous diamond, or an amorphous oxide such as $SiO_2$, $HfO_x$, or $AlO_x$. It should be noted that silicon carbon is a material having C introduced into the Si substitution sites, or a material like carbon-doped silicon. Silicon carbide is a material that is entirely different from silicon carbon even in terms of crystal shape. It is also possible to use an ion conductor such as silver sulfide, copper sulfide, or silver iodide.

In this embodiment, a metal-nonmetal compound conductor that has a film thickness of several nanometers to several tens of nanometers, and contains a metal element and a nonmetal element is used for the opposite electrodes 26. Specific examples of such compound conductors include silicides such as $TiSi_2$, $CoSi_2$, NiSi, $NiSi_2$, PtSi, $WSi_2$, and $MoSi_2$, germanides such as NiGe, and germanosilicides such as NiSiGe. Where the proportion of the metal element among the constituent elements is 50% or lower in such a metal-semiconductor compound, the covalent properties are improved, and particularly, the endurance to rewriting is effectively improved. When a metal-nonmetal compound conductor having excellent covalent properties is used, the metal is not easily ionized and stably exits, compared with that in the case of metal binding. Therefore, ions of the metal in the metal-nonmetal compound conductor hardly diffuse into the variable resistance layer 24.

Other examples of metal-nonmetal compound conductors that can form the opposite electrodes 26 include transition metal nitrides such as TiN and TaN, and transition metal carbides such as TiC and TaC. Those materials do not serve as metal ion sources, and have the characteristics of the barriers to prevent diffusion of the other metal ions. Accordingly, those materials can prevent the ions of metal in the wirings (such as the wirings $30_1$ through $30_3$) from entering the variable resistance layer 24, and degradation of the resistance to rewriting can be prevented. Further, the ions moving through the variable resistance layer 24 do not easily enter the opposite electrodes 26. Accordingly, the metal ions entering the opposite electrodes 26 and accumulated in the opposite electrodes 26 serve as the ion sources, and degradation of the resistance to rewriting and degradation of reliability can be prevented.

Preferred combinations of materials for the ion source electrodes in a case where a silicided metal is used for the opposite electrodes 26 are as shown in the table below. Those combinations are chosen by taking into account the silicidation temperature and melting temperature of the ion source electrodes.

TABLE 1

| Opposite electrode | Ion source electrode |
| --- | --- |
| $WSi_2$ | Ag, Cu, or Au |
| $MoSi_2$ | Ag, Cu, or Au |
| $TiSi_2$ | Ag, Cu, Au, Al, or W |
| $CoSi_2$ | Ag, Cu, Au, Al, W, or Ti |
| $NiSi_2$ | Ag, Cu, Au, Al, W, Ti, or Co |
| PtSi | Ag, Cu, Au, Al, W, Ti, or Co |
| NiSi | Ag, Cu, Au, Al, W, Ti, or Co |
| NiPtSi | Ag, Cu, Au, Al, W, Ti, or Co |

In a case where a metal-nonmetal compound is used for the opposite electrodes 26, the second wirings $30_1$ through $30_3$ are preferably made of a metal having a lower resistivity than that of the above described metal-nonmetal compound. For example, if the opposite electrodes 26 are made of tungsten silicide ($WSi_2$), the second wirings $30_1$ through $30_3$ are made of W, for example. The resistivity of $WSi_2$ is approximately 70 $\mu\Omega$cm, and the resistivity of W is approximately 0.5 $\mu\Omega$cm. A carbon nanotube can be used as the second wirings $30_1$ through $30_3$.

Figure 5A:
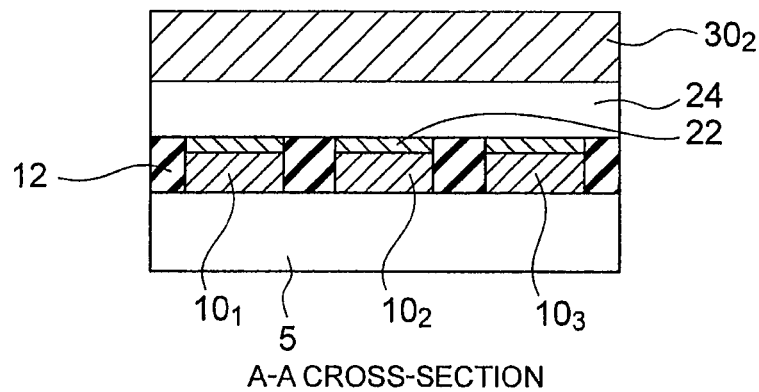
FIG. 5A is a cross-sectional view illustrating procedures for manufacturing the variable resistance element according to the first embodiment.
Figure 5B:
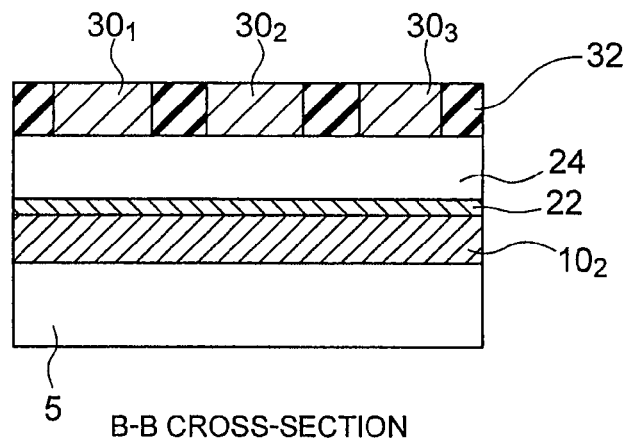
FIG. 5B is a cross-sectional view illustrating procedures for manufacturing the variable resistance element according to the first embodiment.

Referring now to FIGS. 5A and 5B, a method of manufacturing the variable resistance memory according to the first embodiment is described.

The interlayer insulating film 12 is formed on the supporting substrate 5, and the grooves for the first wirings are formed in the interlayer insulating film 12 by using a lithography technique. After that, the grooves are filled with a metal material to form the first wirings, and the upper surface is flattened by using CMP (Chemical Mechanical Polishing), to form the first wirings $10_1$ through $10_3$ (FIG. 5A). It should be noted that the order of formation of the first wirings $10_1$ through $10_3$ and the interlayer insulating film 12 can be reversed.

An Ag layer as the ion source electrode material is then formed so as to cover the first wirings $10_1$ through $10_3$ and the interlayer insulating film 12. Patterning is performed on the Ag layer by using a lithography technique, to form the ion source electrodes 22 made of Ag on the first wirings $10_1$ through $10_3$ (FIG. 2A). In the structure illustrated in FIG. 2B and FIG. 5B, on the other hand, grooves for the first wirings and the ion source electrodes are formed in the interlayer insulating film 12. After that, a metal material to be the first wirings is deposited in the grooves, and the material (Ag) for the ion source electrodes is deposited on the metal material. In this manner, the grooves are filled with the electrodes having two-layer structures formed with the metal material and the ion source electrode material. After that, the upper surface is flattened by using CMP (Chemical Mechanical Polishing), for example, to form the first wirings $10_1$ through $10_3$ and the ion source electrodes 22.

An amorphous silicon layer to be the variable resistance layer 24 is then formed so as to cover the ion source electrodes 22 and the interlayer insulating film 12.

After that, as shown in FIG. 5B, an interlayer insulating film 32 is formed on the variable resistance layer 24, to form grooves having the shapes of the second wirings in the interlayer insulating film 32. The bottom faces of the grooves are a part of the upper face of the variable resistance layer 24. A Ti layer is then formed so as to cover the interlayer insulating film 32. At this point, the lower face of the Ti layer is partially in contact with the amorphous silicon layer 24. After that, flattening is performed on the Ti layer by using CMP, to partially expose the upper face of the interlayer insulating film 32. In this manner, the Ti layers to be the materials of the opposite electrodes 26 and the second wirings $30_1$ through $30_3$ are formed (FIGS. 5A and 5B).

At a temperature equal to or lower than the crystallization temperature for amorphous silicon, the regions where the amorphous silicon layer 24 is in contact with the Ti layers are silicided. As a result of this, upper portions of the amorphous silicon layer 24 react with the bottom portions of the Ti layers, and are silicided to form the opposite electrodes 26. The upper portions of the Ti layers turn into the second wirings $30_1$ through $30_3$ (FIG. 3). At this point, silicon is easily supplied from the surrounding regions to the lower faces of the opposite electrodes 26. However, silicon is not easily supplied from the surrounding regions to the upper portions of the side faces of the opposite electrodes 26, since the interlayer insulating film 32 and the like exist at the upper portions of the side faces of the opposite electrodes 26. Therefore, the voids 29 are formed at the side portions of the opposite electrodes 26. As shown in FIG. 3, the amorphous silicon remains in the regions between the voids 29 under the interlayer insulating film 32. If the distances between the second wirings $30_1$ through $30_3$ are short, the voids 29 at side portions of each two adjacent opposite electrodes 26 might be joined to each other, and one void might be formed between each two adjacent opposite electrodes 26.

In the first embodiment, there exists only one variable resistance element layer. However, more than one variable resistance element layer can be formed. In such a case, each variable resistance element layer is interposed between first wirings and second wirings, and each two adjacent variable resistance element layers share wirings. For example, a second variable resistance element layer shown in FIG. 1 can be formed on the second wirings $30_1$ through $30_3$, the same wirings as the first wirings can be formed on the second variable resistance element layer, and the second wirings $30_1$ through $30_3$ can serve as shared wirings.

In the first embodiment, the second wirings are single layers, and a metal that is easily silicided is used as the metal material to be the second wirings. However, each second wiring can be a stack structure formed by stacking first through third metal layers in this order. A metal that is easily silicided, such as Ti, is used for the first and third metal layers, and a metal that is not easily silicided and has a low resistance, such as TiN, is used for the second metal layer. A variable resistance element formed by stacking layers in the order that is the reverse of the order in this embodiment can be formed on the third metal layer. That is, first and second variable resistance elements can be arranged to sandwich the second wirings, and the stacking order in the stack structure of the first variable resistance element is the reverse of the stacking order in the stack structure of the second variable resistance element. In this case, the resistance of the second wirings can be lowered.

As described above, according to the first embodiment, current leakage between adjacent cells can be prevented.

Second Embodiment

Figure 6:
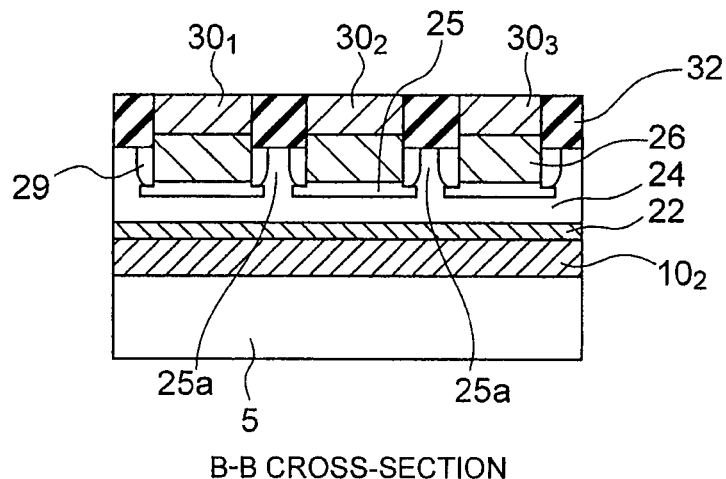
FIG. 6 is a cross-sectional view of the variable resistance element according to a second embodiment.
Figure 7:
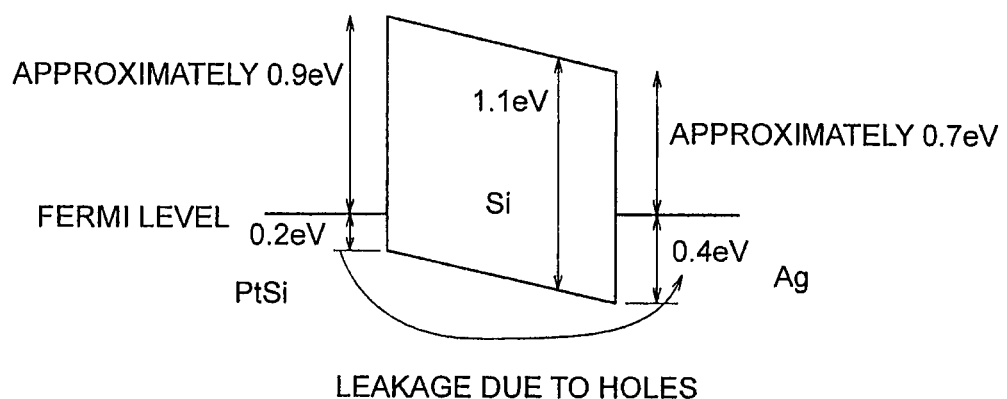
FIG. 7 is a band diagram of a variable resistance element in a case where an impurity semiconductor layer is not provided.
Figure 8:
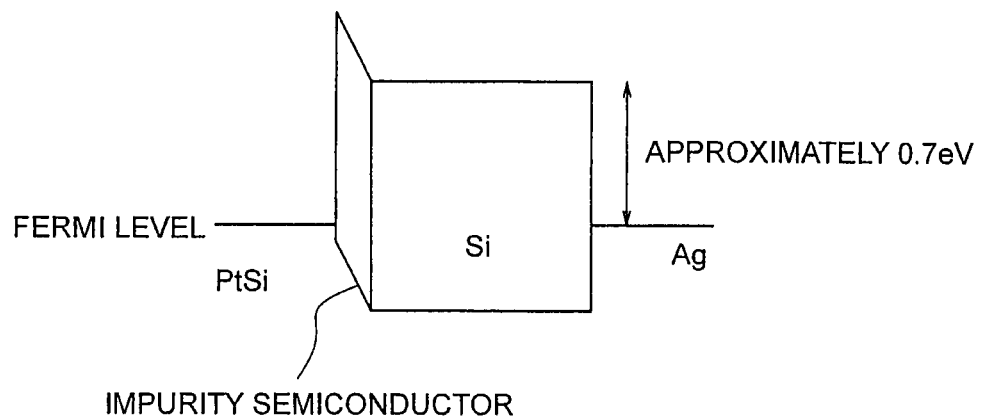
FIG. 8 is a band diagram of a variable resistance element in the second embodiment.

Referring now to FIGS. 6 through 8, a variable resistance memory according to a second embodiment is described. The variable resistance memory of the second embodiment is the same as that of the first embodiment, except that an impurity semiconductor layer 25 is provided between the variable resistance layer 24 and each opposite electrode 26 in the variable resistance element layer 20 (FIG. 6). As shown in FIG. 6, in the second embodiment, the voids 29 are also formed at the side portions of each opposite electrode 26, as in the first embodiment. It should be noted that FIG. 6 is a cross-sectional view of the variable resistance memory, taken along the section line B-B defined in FIG. 1.

In the second embodiment, the impurity semiconductor layer 25 is a Si layer that has a thickness of several nanometers and contains boron (B) at a density of $1\times10^{18}$ cm$^{-3}$ or higher. However, the impurity semiconductor layer 25 can be a Si, Ge, SiGe, or SiC layer or the like containing an impurity such as In, Mg, P, As, Sb, or S at $1\times10^{18}$ cm$^{-3}$ or higher. Meanwhile, Ag is used for the ion source electrodes 22, amorphous silicon is used for the variable resistance layer 24, and PtSi is used for the opposite electrodes 26.

In a case where the impurity semiconductor layers 25 are not provided, at the junction interface between the variable resistance layer 24 and the opposite electrodes 26, the Fermi level in the band is determined in accordance with the surface electronic states of the variable resistance layer 24 and the opposite electrodes 26, and a schottky barrier is formed. In a case where the opposite electrodes 26 are made of PtSi while the variable resistance layer 24 is made of Si, the Fermi level is at approximately 0.2 eV upper from the valence band edge. That is, the schottky barrier height with respect to holes is approximately 0.2 eV. In a case where the ion source electrodes 22 are made of Ag while the variable resistance layer 24 is made of Si, the schottky barrier height with respect to holes is approximately 0.4 eV at each junction. Therefore, in a case where the impurity semiconductor layers 25 do not exist, the opposite electrodes 26 made of PtSi, the variable resistance layer 24 made of amorphous silicon, and the filaments 23 made of Ag have the band diagram shown in FIG. 7. Where the filaments 23 do not exist, the variable resistance layer 24 is almost an insulator and does not terminate lines of electric force. Therefore, an electric field in accordance with the difference in schottky barrier height between an Ag/Si junction and a PtSi/Si junction is generated in the variable resistance layer 24. Therefore, even when a voltage is not applied, the filament 23 made of Ag might be cut off or generated by the internal electric field, and the reliability of the memory might be degraded.

FIG. 8 shows the band diagram obtained in a case where the impurity semiconductor layers 25 that are made of Si and have B segregated at a high density are inserted to the interfaces between the variable resistance layer 24 made of amorphous silicon and the opposite electrodes 26 made of PtSi as in the second embodiment. Since charges can exist at a high density in the impurity semiconductor layers 25, the band curves sharply. As a result, the band curves only between the PtSi opposite electrodes 26 and the amorphous-silicon variable resistance layer 24, and the electric field does not reach the insides of the variable resistance layer 24. Accordingly, when a voltage is not applied, electric fields are not generated in the variable resistance layer 24. Thus, the Ag filaments 23 are neither generated nor cut off, and the reliability of the memory is increased.

Further, since the schottky barrier of the holes is low at each PtSi/Si junction, the holes can easily go past the schottky barrier, and part of the holes can reach the Ag ion source electrodes 22, as shown in FIG. 7. This results in the current leakage at the time of resetting, and cause inadvertent reading. However, by providing the impurity semiconductor layers 25 as in the second embodiment, the internal electric field is absorbed by the impurity semiconductor layers 25, and hardly exist in the variable resistance layer 24. Accordingly, even if holes enter the impurity semiconductor layers 25 from the PtSi opposite electrodes 26, those holes do not easily reach the interfaces with the Ag filaments 23. Thus, the current leakage at the time of resetting can be restricted to a small amount, and inadvertent reading can be restrained.

Figure 9:
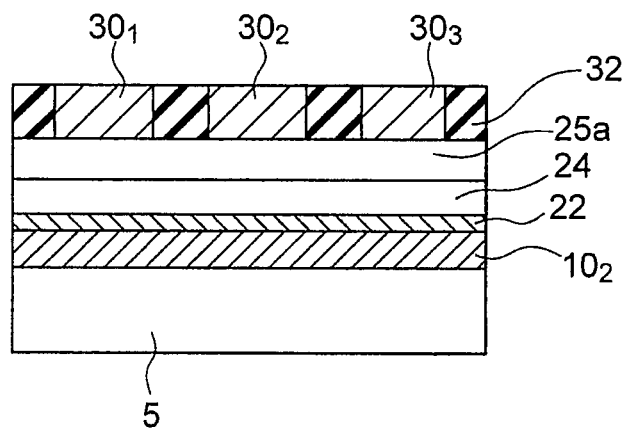
FIG. 9 is a cross-sectional view illustrating procedures for manufacturing the variable resistance element according to the second embodiment.

Referring now to FIG. 9, a method of forming the impurity semiconductor layers 25 in the second embodiment is described. It should be noted that FIG. 9 is a cross-sectional view taken along the section line B-B defined in FIG. 1.

First, amorphous silicon layers 24 that contain no impurities and have a thickness of 10 nm, for example, are formed on the ion source electrodes 22 by CVD or the like. After that, an amorphous silicon layer 25a that contains B as an impurity at $1\times10^{17}$ cm$^{-3}$ or higher and has a thickness of 10 nm is formed (FIG. 9). Alternatively, an amorphous silicon layer that contains no impurities and has a thickness of 20 nm can be formed, and can be doped with B at $1\times10^{17}$ cm$^{-3}$ or higher from the surface to the depth of 10 nm by ion implantation or the like, to form the amorphous silicon layer 25a containing an impurity (FIG. 9).

The interlayer insulating film 32 is then formed on the amorphous silicon layer 25a containing the impurity, and grooves in the shapes of the second wirings are formed in the interlayer insulating film 32, as shown in FIG. 9. The bottom faces of the grooves are part of the upper face of the amorphous silicon layer 25a containing the impurity. A Ti layer is then formed so as to cover the interlayer insulating film 32. At this point, the lower face of the Ti layer is partially in contact with the amorphous silicon layer 25a containing the impurity. After that, flattening is performed on the Ti layer by using CMP, for example, to partially expose the upper face of the interlayer insulating film 32. In this manner, the Ti layers to be the materials of the opposite electrodes 26 and the second wirings $30_1$ through $30_3$ are formed (FIG. 9).

At a temperature lower than the crystallization temperature for amorphous silicon, the regions where the amorphous silicon layer 25a containing the impurity is in contact with the Ti layers are silicided. As a result of this, upper portions of the amorphous silicon layer 25a containing the impurity react with the bottom portions of the Ti layers, and are silicided to form the opposite electrodes 26. The upper portions of the Ti layers turn into the second wirings $30_1$ through $30_3$ (FIG. 9). The silicide grows and enter the amorphous silicon layer while absorbing the Si in the amorphous silicon layer. However, the impurity does not easily enter the silicide, and therefore, the impurity is concentrated at the interface between the silicide and the amorphous silicon, to form a segregation layer. As a result, the impurity semiconductor layers 25 containing an impurity at $1\times10^{18}$ cm$^{-3}$ or higher are formed at the interfaces between the variable resistance layer 24 and the silicide opposite electrodes 26. In this case, the voids 29 shown in FIG. 6 are formed at the side portions of the opposite electrodes 26 and at the side portions of the impurity semiconductor layers 25, and the amorphous silicon layer 25a containing the impurity remains in the regions between the voids 29 under the interlayer insulating film 32 (FIG. 6).

In the second embodiment, voids are formed at the side portions of the opposite electrodes 26, as in the first embodiment. Accordingly, current leakage between adjacent cells can be prevented.

Third Embodiment

Figure 10:
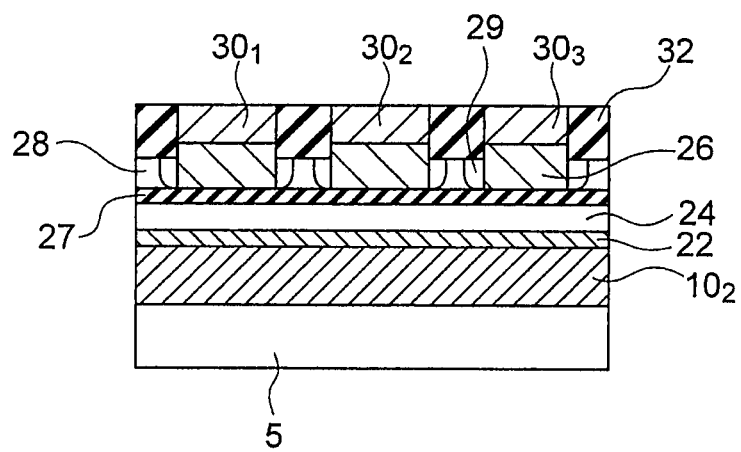
FIG. 10 is a cross-sectional view of the variable resistance element according to a third embodiment.
Figure 11:
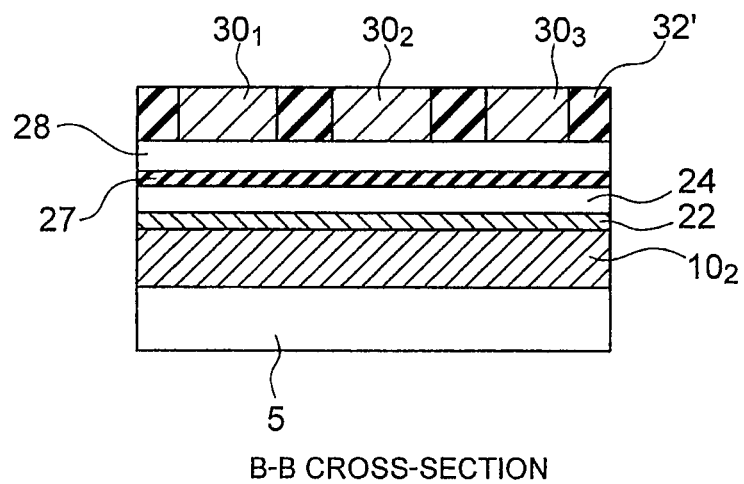
FIG. 11 is a cross-sectional view illustrating procedures for manufacturing the variable resistance element according to the third embodiment.

Referring now to FIGS. 10 and 11, a variable resistance memory according to a third embodiment is described. The variable resistance memory of the third embodiment differs from that of the first embodiment in that an insulating film 27 is formed between the variable resistance layer 24 and the opposite electrodes 26 in the variable resistance element layer 20 (FIG. 10). As shown in FIG. 10, in the third embodiment, voids are formed at the side portions of the opposite electrodes 26, as in the first embodiment. FIG. 10 is a cross-sectional view taken along the section line B-B defined in FIG. 1. In FIG. 10, reference numeral 28 denotes the filler provided between the insulating film 27 and the interlayer insulating film 32, and the filler is amorphous silicon or polycrystalline silicon.

In the third embodiment, the insulating film 27 is a SiN film of several nanometers in thickness. Alternatively, the insulating film 27 can be made of $SiO_2$, MgO, $HfO_x$, $AlO_x$, or the like.

When a positive voltage is applied to the ion source electrodes 22 made of Ag as opposed to the opposite electrodes 26, Ag ions travel into the variable resistance layer 24 made of amorphous silicon from the ion source electrodes 22, and filaments are formed and reach the insulating film 27. The Ag ions are trapped in the insulating film 27, and therefore, do not easily enter the opposite electrodes 26. Accordingly, accumulation of the Ag ions in the opposite electrodes 26 can be prevented, and the Ag ions remaining in the opposite electrodes 26 can be prevented from hindering resetting. At this point, electrons tunnel through the insulating film 27, and current flows between the first and second wirings.

When a voltage is applied between the ion source electrodes 22 and the opposite electrodes 26, a large voltage drop occurs in the insulating film 27 having a high resistance. Accordingly, the electric field in the variable resistance layer 24 is reduced, and the voltages in the setting and resetting operations shift to the high-voltage side in response to the voltage drop in the insulating film 27. As described above, by inserting the insulating film 27, the setting voltage and the resetting voltage can be controlled to widen the window for the readout voltage.

Referring now to FIG. 11, a method of forming the variable resistance memory according to the third embodiment is described. FIG. 11 is a cross-sectional view taken along the section line B-B defined in FIG. 1. As in the first embodiment, an amorphous silicon layer to be the variable resistance layer 24 is formed, and the insulating film 27 is formed on the variable resistance layer 24. The filler 28 made of amorphous silicon or polycrystalline silicon is formed on the insulating film 27.

After that, as shown in FIG. 11, the interlayer insulating film 32 is formed on the filler 28, and the grooves in the shapes of the second wirings are formed in the interlayer insulating film 32. The bottom faces of the grooves are part of the upper face of the filler 28. A Ti layer is then formed so as to cover the interlayer insulating film 32. At this point, the lower face of the Ti layer is partially in contact with the amorphous silicon layers 24. After that, flattening is performed on the Ti layer by using CMP, for example, to partially expose the upper face of the interlayer insulating film 32. In this manner, the Ti layers to be the materials of the opposite electrodes 26 and the second wirings $30_1$ through $30_3$ are formed (FIG. 11).

At a temperature equal to or lower than the crystallization temperature for amorphous silicon, the regions where the filler 28 is in contact with the Ti layers are silicided. As a result of this, upper portions of the filler 28 react with the bottom portions of the Ti layers, and are silicided to form the opposite electrodes 26. The upper portions of the Ti layers turn into the second wirings $30_1$ through $30_3$ (FIG. 11). At this point, silicon is easily supplied from the surrounding regions to the side portions of the opposite electrodes 26. However, silicon is not easily supplied from the surrounding regions to the lower faces of the opposite electrodes 26, since the insulating film 27 and the like exist under the lower faces of the opposite electrodes 26. Therefore, the voids 29 are formed at the side portions of the opposite electrodes 26. As shown in FIG. 11, the filler 28 remains in the regions between the voids 29 under the interlayer insulating film 32.

It should be noted that the insulating film 27 can also serve as the stopper at the time of the silicidation. As a result, variations in the distances between the ion source electrodes 22 and the opposite electrodes 26 can be made smaller.

In the third embodiment, voids are formed at the side portions of the opposite electrodes 26, as in the first embodiment. Accordingly, current leakage between adjacent cells can be prevented.

Fourth Embodiment

Figure 12:
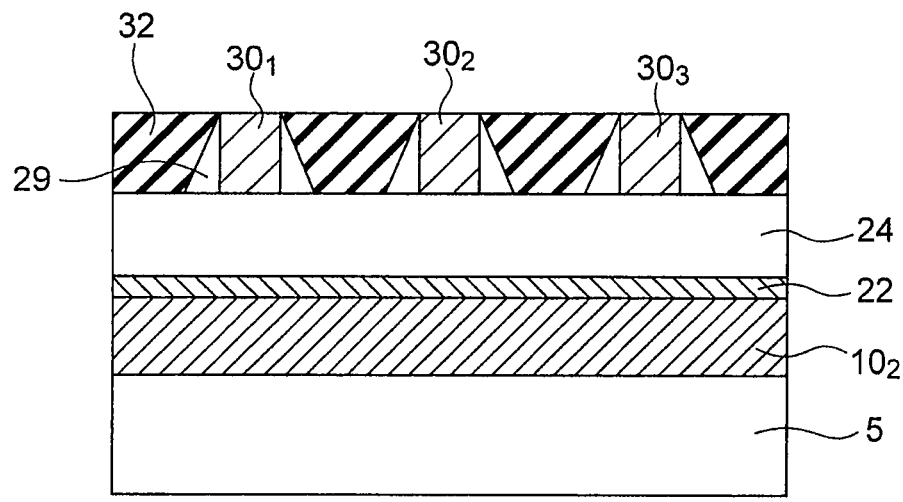
FIG. 12 is a cross-sectional view of the variable resistance element according to a fourth embodiment.

Referring now to FIG. 12, a variable resistance memory according to a fourth embodiment is described. In the first through third embodiments, the voids 29 at the side portions of the opposite electrodes 26 are formed in cases where the opposite electrodes 26 are made of a silicided metal.

In the fourth embodiment, the voids 29 can be formed at the side portions of the opposite electrodes 26 even in a case where a metal other than a silicided metal is used for the opposite electrodes 26 of the first embodiment. FIG. 12 is a cross-sectional view showing a specific example of the procedures for manufacturing the variable resistance memory of the fourth embodiment.

First, the same procedures as those by the manufacturing method described in the first embodiment are carried out until the variable resistance layer 24 is formed. The interlayer insulating film 32 is then formed on the variable resistance layer 24. After that, a resist is applied onto the interlayer insulating film 32, and a resist pattern for the second wirings extending in a direction perpendicular to the extending direction (the horizontal direction in the drawing) of the first wirings 10 is formed by using a lithography technique.

With the resist pattern serving as a mask, etching is performed on the interlayer insulating film 32 by dry etching such as RIE (Reactive Ion Etching), to form the grooves for the second wirings. At this point, the field intensity used in the RIE is made higher, to increase etching anisotropy. As the etching progresses, the field intensity is made lower, to reduce etching anisotropy. As a result, the size (the diameter, for example) of each groove formed in the interlayer insulating film 32 by the etching becomes larger toward the variable resistance layer 24, and grooves each having a so-called reverse tapered structure can be formed. At this point, the upper face of the variable resistance layer 24 is partially exposed through the bottom faces of the grooves.

The metal layers to be the second wirings $30_1$ through $30_3$ are then formed by a technique such as sputtering. As a result of this, the metal does not adhere to the side portions in the grooves, and the voids 29 are formed at the side portions of the second wirings $30_1$ through $30_3$ in the grooves. In the fourth embodiment, the bottom portions of the second wirings $30_1$ through $30_3$ can be regarded as the opposite electrodes. That is, in the fourth embodiment, the second wirings $30_1$ through $30_3$ and the opposite electrodes are made of the same material, and voids are formed at the side portions of the opposite electrodes.

In the variable resistance memory manufactured by the manufacturing method according to the fourth embodiment, voids are also formed at the side portions of the opposite electrodes. Accordingly, current leakage between adjacent cells can be prevented.

In the fourth embodiments, voids are formed at the side portions of the opposite electrodes. However, voids may be formed at the side portions of the ion source electrodes.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A variable resistance memory comprising:
a first wiring;
a second wiring intersecting with the first wiring;
a first electrode provided in an intersection region between the first wiring and the second wiring, the first electrode being connected to the first wiring;
a second electrode connected to the second wiring, the second electrode facing to the first electrode;
a variable resistance layer provided between the first electrode and the second electrode; and
a first semiconductor layer formed at side portions of the second electrode, the first semiconductor layer and the second electrode forming voids at the side portions of the second electrode.

2. The variable resistance memory according to claim 1, further comprising
a second semiconductor layer containing an impurity, the second semiconductor layer being located between the variable resistance layer and the second electrode.

3. The variable resistance memory according to claim 1, further comprising
a first insulating layer located between the variable resistance layer and the second electrode.

4. The variable resistance memory according to claim 1, wherein the second electrode is a metal-semiconductor compound.

5. The variable resistance memory according to claim 4, wherein the second electrode is a silicide, germanide, or germanosilicide of one of Ti, Co, Ni, Pt, W, and Mo.

6. The variable resistance memory according to claim 5, wherein the second wiring is made of W.

7. The variable resistance memory according to claim 1, wherein the first electrode contains a metal, the metal being ionizable in the variable resistance layer.

8. The variable resistance memory according to claim 7, wherein the first electrode is one of Ag, Cu, Au, Al, W, Ti, and Co.

9. The variable resistance memory according to claim 1, wherein the variable resistance layer is an amorphous semiconductor.

10. A variable resistance memory comprising:
a first wiring;
a second wiring intersecting with the first wiring;
a first electrode provided in an intersection region between the first wiring and the second wiring, the first electrode being connected to the first wiring;
a second electrode connected to the second wiring, the second electrode facing to the first electrode; and
a variable resistance layer provided between the first electrode and the second electrode, and provided at side portions of the second electrode, the variable resistance layer being made of a semiconductor, the variable resistance layer and the second electrode forming voids at the side portions of the second electrode.

11. The variable resistance memory according to claim 10, wherein the second electrode is a metal-semiconductor compound and the variable resistance layer contains at least one element of Si, Ge, and C.

12. The variable resistance memory according to claim 11, wherein the second electrode is a silicide, germanide, or germanosilicide of one of Ti, Co, Ni, Pt, W, and Mo.

13. The variable resistance memory according to claim 12, wherein the second wiring is made of W.

14. The variable resistance memory according to claim 10, wherein the first electrode contains a metal, the metal being ionizable in the variable resistance layer.

15. The variable resistance memory according to claim 10, wherein the variable resistance layer is an amorphous semiconductor.

16. A variable resistance memory comprising:
a first wiring;
a second wiring intersecting with the first wiring;
a first electrode provided in an intersection region between the first wiring and the second wiring, the first electrode being connected to the first wiring;
a second electrode connected to the second wiring, the second electrode facing to the first electrode;
a variable resistance layer provided between the first electrode and the second electrode; and
a first insulating layer provided at side portions of the second electrode, the first insulating layer and the second electrode forming voids at the side portions of the second electrode,
wherein a size of each of the voids becomes larger toward the variable resistance layer.

* * * * *